(12) United States Patent
Montgomery

(10) Patent No.: US 8,173,245 B2
(45) Date of Patent: May 8, 2012

(54) PEELABLE TAPE CARRIER

(75) Inventor: Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 735 days.

(21) Appl. No.: 11/397,235

(22) Filed: Apr. 4, 2006

(65) Prior Publication Data
US 2006/0275585 A1 Dec. 7, 2006

Related U.S. Application Data

(60) Provisional application No. 60/686,183, filed on Jun. 1, 2005.

(51) Int. Cl.
*B32B 3/00* (2006.01)
*B32B 3/30* (2006.01)
*H01L 23/32* (2006.01)

(52) U.S. Cl. ........ 428/172; 428/167; 428/212; 428/218; 428/343; 428/354; 257/783

(58) Field of Classification Search ............... 428/42.1, 428/163, 167, 172, 212, 217, 218, 343, 354; 602/52; 257/783
See application file for complete search history.

(56) References Cited

U.S. PATENT DOCUMENTS

| 3,991,754 A | 11/1976 | Gertzman |
| 5,080,957 A | 1/1992 | Leseman et al. ............... 428/167 |
| 5,173,141 A * | 12/1992 | Leseman et al. ......... 156/244.15 |
| 6,372,323 B1 | 4/2002 | Kobe et al. |

FOREIGN PATENT DOCUMENTS

| EP | 0 776 848 | | 4/1997 |
| WO | WO 01/08619 | * | 2/2001 |
| WO | WO 01/08619 A1 | | 7/2001 |

OTHER PUBLICATIONS

Notification of Transmittal of International Search Report and Written Opinion of the International Searching Authority, or the Declaration, Apr. 20, 2007.
International Search Report, May 31, 2006.

* cited by examiner

*Primary Examiner* — Donald J Loney
(74) *Attorney, Agent, or Firm* — Farjami & Farjami LLP

(57) ABSTRACT

A support tape used in semiconductor wafer processing that includes an adhesive tape and a plurality of spaced support ribs arranged on the adhesive tape.

16 Claims, 3 Drawing Sheets

PEELABLE TAPE CARRIER

RELATED APPLICATION

This application is based on and claims benefit of U.S. Provisional Application No. 60/686,183, filed on Jun. 1, 2005, entitled Semi-Rigid Peelable Tape Carrier for Thinned Semiconductor Wafers, to which a claim of priority is hereby made and the disclosure of which is incorporated by reference.

BACKGROUND OF THE INVENTION

The present invention relates to semiconductor processing, and more particularly to a support tape for use in the processing of a semiconductor wafer.

Semiconductor device die are usually formed in a relatively large wafer (e.g. six inches in diameter), and then singulated from the wafer by sawing or the like.

In some cases, the wafers are relatively thick (e.g. 300 microns or more), and can be conveniently handled without breakage by processing tools such as ion implanters, photolithography tools, etching and cleaning equipment, metal deposition and insulation deposition equipment and the like.

It is known that in some cases, the characteristics of the semiconductor device can be improved if the wafer is thinned to, for example, below 250 microns, or even 100 microns or less. Also, it is known that it may be economical to form certain semiconductor devices in float zone type wafers and then thin the wafer to obtain thin semiconductor devices.

Wafers can be thinned by back grinding after the major wafer processing steps are completed. For example, wafers can be thinned to 80 microns or less after the top surface processing has been completed. For example, after the top surface processing is completed, a flexible tape is adhered to the processed front side of the wafer and the back side is suitably ground to the desired thickness. The flexible tape may be a plastic film of the kind commercially known as backgrind tape, which holds the wafer during the thinning process. The backgrind tape is peelable from the wafer.

In the case of thinned wafers, as the wafer is thinned it loses rigidity. Thus, it becomes difficult to handle the wafer. For example, it becomes difficult to remove the wafer from the grinding system without breaking the wafer. Excessive breakage negatively affects the yield and adversely affects any cost savings that may have been achieved by the wafer thinning method.

To overcome the problem, the prior art has suggested either using a more rigid carrier backing or a rigid carrier. A more rigid backing, however, does not bend or fold easily, making it difficult to remove from the thinned wafer without causing damage to the same. Also, rigid carriers are more complex to use since the carrier must be attached with an adhesive and will be very hard to remove without consequent damage to the thinned wafer.

SUMMARY OF THE INVENTION

It is an object of the present invention to reduce the number of incidents of breakage of thinned wafers.

A support tape according to the present invention exhibits a higher resistance to bending or folding in one direction, while exhibiting a relatively lower resistance to bending or folding in the peeling direction.

A support tape according to the present invention includes an adhesive tape having an adhesive on one surface thereof, and a plurality of spaced support ribs arranged opposite the adhesive. The support ribs are more rigid than the adhesive tape. As a result, a support tape according to the present invention is less resistant to bending or folding in at least one direction compared to other directions of bending or folding. The use of a support tape according to the present invention, therefore, allows, for example, a thinned wafer to be handled by the grinding machine (or other processing apparatus), while also allowing the tape to be peeled away from the wafer with a lessened likelihood of breakage.

Other features and advantages of the present invention will become apparent from the following description of the invention which refers to the accompanying drawings.

DETAILED DESCRIPTION OF THE FIGURES

Figure 1A:
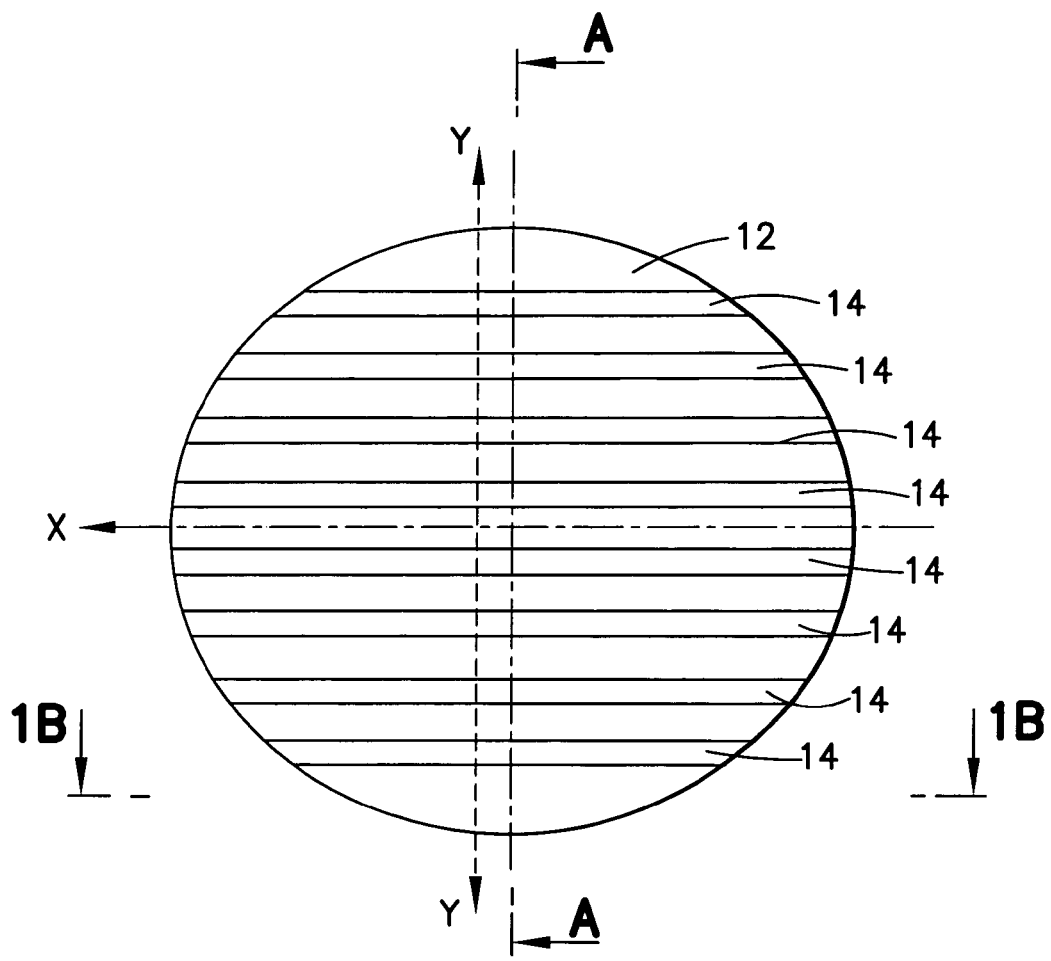
FIG. 1A schematically shows a top plan view of a support tape according to the present invention.
Figure 1B:
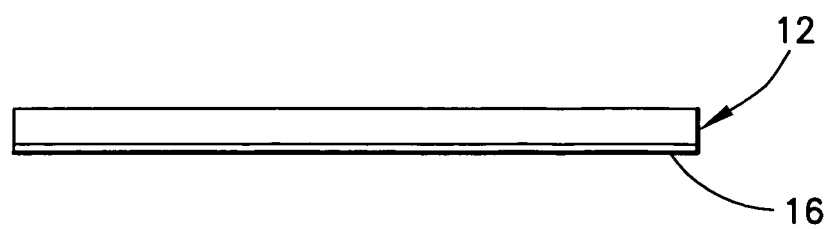
FIG. 1B schematically shows a cross-sectional view of a support tape according to the present invention along line IB-IB and viewed in the direction of the arrows.

Referring to FIGS. 1A-1B, support tape 10 according to the present invention includes adhesive tape 12 having an adhesive 16 on one surface thereof, and a plurality of spaced and preferably parallel support ribs 14 arranged opposite adhesive 16. According to the present invention adhesive tape 12 has a first rigidity value and each support rib 14 has a second rigidity value, which is higher than the first rigidity value. As a result, support tape 10 according to the present invention exhibits more rigidity when subjected to folding or bending action around axis Y (which is generally orthogonal to support ribs 14) than when subjected to bending or folding action around axis X (which is generally parallel to the direction of elongation of support ribs 14). Thus, due to the spacing between support ribs 14, adhesive tape 12 between support ribs 14 bends easily when being peeled in a direction that is generally orthogonal to support ribs 14.

Figure 2:
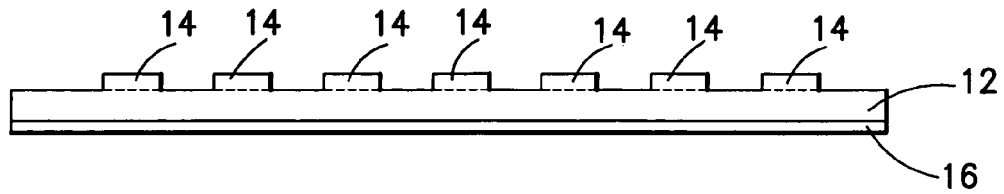
FIG. 2 schematically shows a cross-sectional view of a support tape according to the first embodiment of the present invention as would be seen along line A-A of FIG. 1A in the direction of the arrows.

Referring to FIG. 2, according to the first embodiment of the present invention, support ribs 14 are thickened regions integral with adhesive tape 12 and forming a unitary body with the same. Thus, support ribs 14 in the first embodiment of the present invention, due to their enlarged dimensions, are more rigid compared to adhesive tape 12 portion of support tape 10.

Figure 3:
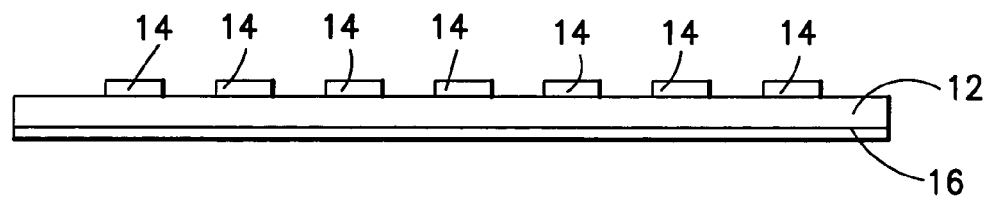
FIG. 3 schematically shows a cross-sectional view of a support tape according to the second embodiment of the present invention as would be seen along line A-A in the direction of the arrows.

Referring next to FIG. 3, a support tape according to the second embodiment of the present invention includes support ribs 14 made from a material that is different from the material forming adhesive tape 12. That is, support ribs 14 may be made from a material that is inherently more rigid than the material forming the body of adhesive tape 12. Support ribs 14 in the second embodiment of the present invention may be attached to adhesive tape 12 with any suitable adhesive, or fused with the same to form an integrated body.

Figure 4:
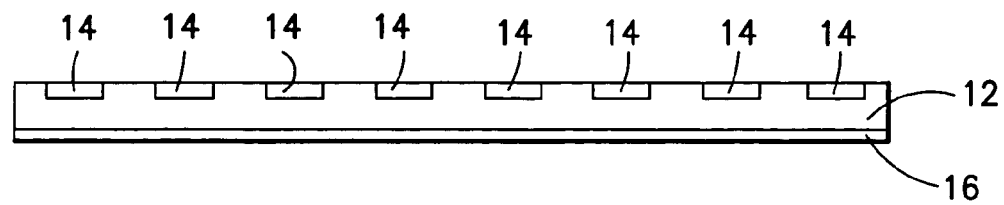
FIG. 4 schematically shows a cross-sectional view of a support tape according to the third embodiment of the present invention as would be seen along line A-A in FIG. 1A in the direction of the arrows.

Referring next to FIG. 4, according to the third embodiment, support ribs 14 are embedded in the body of adhesive tape 12. Preferably, support ribs 14 are made from a material that is inherently more rigid than a material forming the body of adhesive tape 12.

Preferably, adhesive tape 12 is made from the same material that is used to form a conventional backgrind tape, although other materials for forming adhesive tape 12 can be used without deviating from the spirit and scope of the present invention. Also, support ribs 14 may be preferably made from any suitable plastic material, although other materials may be used without deviating from the spirit and cope of the present invention. In addition, adhesive 16 may be preferably any suitable pressure sensitive adhesive rendering a support tape according to the present invention readily peelable from a semiconductor wafer, although other types of adhesives such as UV activated, UV releasable, or heat-activated, or heat-releasable adhesives may be used to form adhesive 16 without deviating from the scope and spirit of the present invention.

Figure 5:
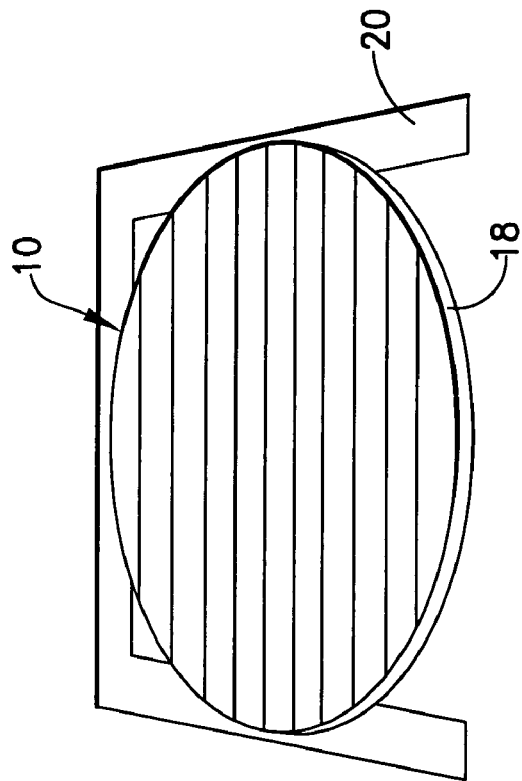
FIG. 5 schematically illustrates the application of a support tape according to the present invention to a wafer.

Referring next to FIG. 5, a support tape 10 according to the present invention as applied to a wafer 18 will give wafer 18 enough rigidity in one direction so that wafer 18 does not sag when held in a standard cassette 20. As a result, the handling of a thin wafer (e.g. 100 mm thick or thinner wafer) can be improved. Note that a support tape according to the present invention is applied to a wafer 18 prior to the thinning of wafer 18 and thereafter remains adhered to wafer 18 in order to facilitate its handling.

Figure 6:
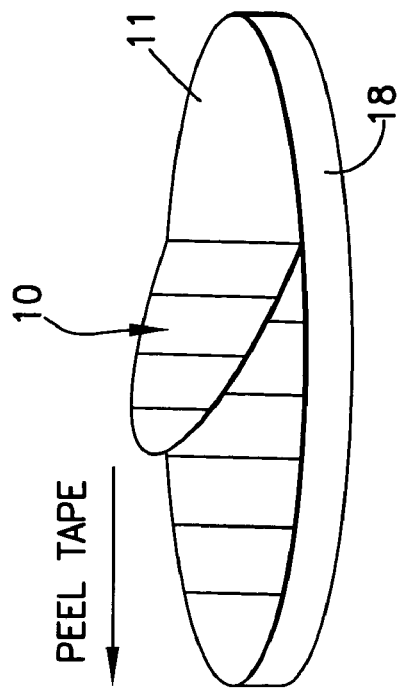
FIG. 6 schematically illustrates the peeling of a support tape according to the present invention from a wafer.

Referring next to FIG. 6, a support tape 10 according to the present invention can then be peeled off from wafer 18 after thinning in a direction orthogonal to support ribs 14 as described above.

Note that the primary function of adhesive tape 12 is to render mechanical support to the wafer during the back grinding operation, and preferably, unlike dicing tape, adhesive tape 12 is not expandable. For example, when processing a wafer containing a plurality of vertical conduction power devices such as vertical conduction type MOSFETs, adhesive tape 12 is attached to the front side of the wafer and the wafer is thinned by grinding from the backside. The thinned wafer can then be removed and singulated by, for example, dicing. In another variation, the wafer can be singulated prior to the removal of adhesive tape 12.

Alternatively, the wafer can be partially diced. That is, for example, the front side of the wafer is diced but not all the way through its thickness. The adhesive tape 12 is then attached to the wafer and the portion which has not been diced is removed by grinding or the like process, whereby the die are singulated. Preferably adhesive tape 12 is rendered mechanically rigid enough for dicing before grinding as described above.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A support tape comprising:
   a non-expandable adhesive tape comprised of backgrind tape having a first rigidity value and an adhesive on a first surface thereof for completely covering a major surface of a semiconductor wafer; and
   a plurality of laterally spaced elongated support ribs arranged on a side of said adhesive tape opposite said adhesive and having a second rigidity value, wherein said second rigidity value is higher than said first rigidity value to enable a greater folding or bending action of said adhesive tape when peeling said adhesive tape from said semiconductor wafer in a direction orthogonal to a direction of elongation for said ribs compared to peeling in a direction parallel to said direction of elongation for said ribs;
   wherein said adhesive tape and said plurality of laterally spaced elongated support ribs provide a rigid support which does not sag, enabling said semiconductor wafer to be thinned and said adhesive tape to be removed without breakage of said semiconductor wafer.

2. The support tape of claim 1, wherein said spaced ribs parallel one another.

3. The support tape of claim 1, wherein said adhesive is pressure sensitive.

4. The support tape of claim 1, wherein said ribs are integrated with said backgrind tape.

5. The support tape of claim 1, wherein said backgrind tape and said ribs are comprised of dissimilar materials.

6. The support tape of claim 1, wherein said ribs are comprised of rigid plastic.

7. The support tape of claim 1, wherein said ribs are thickened regions of said backgrind tape.

8. The support tape of claim 1, wherein said ribs are coupled to said backgrind tape.

9. The support tape of claim 1, wherein said ribs and said backgrind tape are integrated.

10. The support tape of claim 1, wherein said ribs are embedded in said backgrind tape.

11. The support tape of claim 1, wherein said adhesive is UV activated.

12. The support tape of claim 1, wherein said adhesive is heat activated.

13. The support tape of claim 1, wherein said adhesive is UV releasable.

14. The support tape of claim 1, wherein said adhesive is heat releasable.

15. The support tape of claim 1, wherein said rigid support provided by said adhesive tape allows said semiconductor wafer to be thinned to a thickness 250 μm or less without breakage.

16. The support tape of claim 15, wherein said thickness is 100 μm or less.

* * * * *